United States Patent
Chou et al.

(10) Patent No.: US 12,176,050 B2
(45) Date of Patent: Dec. 24, 2024

(54) SIGNAL PROCESSING METHOD AND SIGNAL PROCESSOR

(71) Applicant: Realtek Semiconductor Corporation, Hsinchu (TW)

(72) Inventors: Hong-Ru Chou, Hsinchu (TW); Wen-Chih Fang, Hsinchu (TW); Yung-Le Chang, Hsinchu (TW); Bo-Cheng Lin, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 168 days.

(21) Appl. No.: 17/646,299

(22) Filed: Dec. 29, 2021

(65) Prior Publication Data
US 2023/0052659 A1 Feb. 16, 2023

(30) Foreign Application Priority Data
Aug. 13, 2021 (TW) .................. 110129960

(51) Int. Cl.
*G11C 19/18* (2006.01)
*G06F 3/00* (2006.01)
*G11C 7/10* (2006.01)
*G11C 19/28* (2006.01)
*G11C 29/02* (2006.01)

(52) U.S. Cl.
CPC ............ *G11C 19/188* (2013.01); *G06F 3/007* (2013.01); *G11C 7/1039* (2013.01); *G11C 19/184* (2013.01); *G11C 19/285* (2013.01)

(58) Field of Classification Search
CPC ....................... B41J 2/04548; G06F 1/3203
See application file for complete search history.

(56) References Cited

U.S. PATENT DOCUMENTS

| | | | | |
|---|---|---|---|---|
| 5,818,607 A | * | 10/1998 | Nakamura | H04N 1/4175 |
| | | | | 358/426.05 |
| 9,360,915 B1 | * | 6/2016 | Schuttenberg | G06F 1/3203 |
| 2002/0158928 A1 | * | 10/2002 | Fujii | B41J 2/04548 |
| | | | | 347/12 |
| 2003/0059118 A1 | * | 3/2003 | Suzuki | H04N 19/70 |
| | | | | 375/E7.199 |
| 2011/0022823 A1 | * | 1/2011 | Miwa | G06F 9/3001 |
| | | | | 712/E9.016 |
| 2019/0238136 A1 | * | 8/2019 | Asnaashari | H03K 19/1774 |
| 2020/0411021 A1 | * | 12/2020 | Hamada | G11B 27/30 |

FOREIGN PATENT DOCUMENTS

TW 215509 B 11/1993

* cited by examiner

*Primary Examiner* — Getente A Yimer
(74) *Attorney, Agent, or Firm* — CKC & Partners Co., LLC

(57) ABSTRACT

A signal processing method includes the following operations: receiving an input signal and analyzing the input signal to generate a plurality of bit codes by a signal receiving circuit; temporarily storing a first part of the plurality of bit codes according to a time sequence by a shift register and starting a decoder when the shift register is full; and performing a boundary calibration according to the first part of the plurality of bit codes by the decoder when the first part of the plurality of bit codes meets a decoding table rule and a boundary detection rule.

20 Claims, 6 Drawing Sheets

300

| symbolic name | 4B | 5B | special function |
|---|---|---|---|
| 0 | 0000 | 11110 | — |
| 1 | 0001 | 01001 | — |
| 2 | 0010 | 10100 | — |
| 3 | 0011 | 10101 | — |
| 4 | 0100 | 01010 | — |
| 5 | 0101 | 01011 | — |
| 6 | 0110 | 01110 | — |
| 7 | 0111 | 01111 | — |
| 8 | 1000 | 10010 | — |
| 9 | 1001 | 10011 | — |
| A | 1010 | 10110 | — |
| B | 1011 | 10111 | — |
| C | 1100 | 11010 | — |
| D | 1101 | 11011 | — |
| E | 1110 | 11100 | — |
| F | 1111 | 11101 | — |
| I | N/A | 11111 | SILENCE |
| J | N/A | 11000 | SYNC/COMMIT |
| K | N/A | 10001 | ESDERR |
| T | N/A | 01101 | ESD/HB |
| R | N/A | 00111 | ESDOK/ESDBRS |
| H | N/A | 00100 | SSD |
| N | N/A | 01000 | BEACON |
| S | N/A | 11001 | ESDJAB |

Fig. 3

SIGNAL PROCESSING METHOD AND SIGNAL PROCESSOR

CROSS-REFERENCE TO RELATED APPLICATION

This application claims the priority benefit of TAIWAN Application serial no. 110129960, filed Aug. 13, 2021, the full disclosure of which is incorporated herein by reference.

FIELD OF INVENTION

The invention relates to a signal processing method and a signal processor. More particularly, the invention relates to a signal processing method and a signal processor of decoding boundary calibration.

BACKGROUND

In the 10BASE-T1S specification, the physical layer converts the 4B symbol that needs to be transmitted into 5B symbol through 4B/5B encoding, and then the 5B symbol will undergo Differential Manchester Encoding (DME) and each bit code is converted into DME symbol, and the data of both parties is transmitted in the way of serial transmission. However, in the process of data transmission, due to factors such as channel effect and radio frequency, the DME symbols of the receiving end may be corrupted or lost during the initial process of receiving data and cause 5B boundary detection errors. Therefore, a 5B boundary detection strategy is in need to solve this problem.

SUMMARY

An aspect of this disclosure is to provide a signal processing method includes the following operations: receiving an input signal and analyzing the input signal to generate a plurality of bit codes by a signal receiving circuit; temporarily storing a first part of the plurality of bit codes according to a time sequence by a shift register and starting a decoder when the shift register is full; and performing a boundary calibration according to the first part of the plurality of bit codes by the decoder when the first part of the plurality of bit codes meets a decoding table rule and a boundary detection rule.

Another aspect of this disclosure is to provide a signal processor. The signal processor includes a signal receiving circuit, a shift register, and a decoder. The signal receiving circuit is configured to receive an input signal and to analyze the input signal to generate a plurality of bit codes. The shift register is configured to temporarily store a first part of the plurality of bit codes according to a time sequence. The decoder is configured to start when the shift register is full and configured to perform a boundary calibration according to the first part of the plurality of bit codes when the first part of the plurality of bit codes meets a decoding table rule and a boundary detection rule.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a 4B/5B coding comparison chart according to some embodiments of the present disclosure.

DETAILED DESCRIPTION

Figure 1:
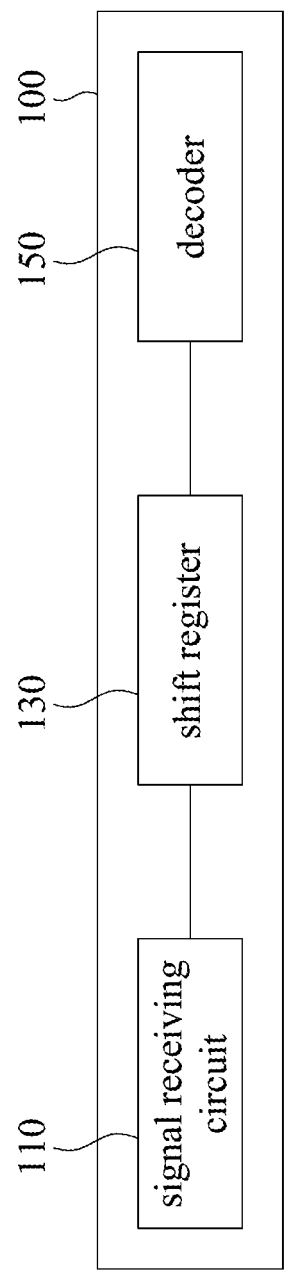
FIG. 1 is a schematic diagram illustrating a signal processor according to some embodiments of the present disclosure.

The following disclosure provides many different embodiments, or examples, for implementing different features of the invention. Specific examples of elements and arrangements are described lower than to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed lower than, or elsewhere in the specification, to provide additional guidance to the practitioner regarding the description of the invention.

Reference is made to FIG. 1. FIG. 1 is a schematic diagram illustrating a signal processor 100 according to some embodiments of the present disclosure. As illustrated in FIG. 1, the signal processor 100 includes a signal receiving circuit 110, a shift register 130, and a decoder 150. In the connection relationship, the signal receiving circuit 110 couples to the shift register 130, the shift register 130 is coupled to the decoder 150.

The configuration of the signal processor 100 mentioning above is for illustrative purposes only, and various configurations of the signal processor 100 are within the scope of the present disclosure. The detailed operation of the signal processor 100 will be explained in reference to FIG. 2.

Figure 2:
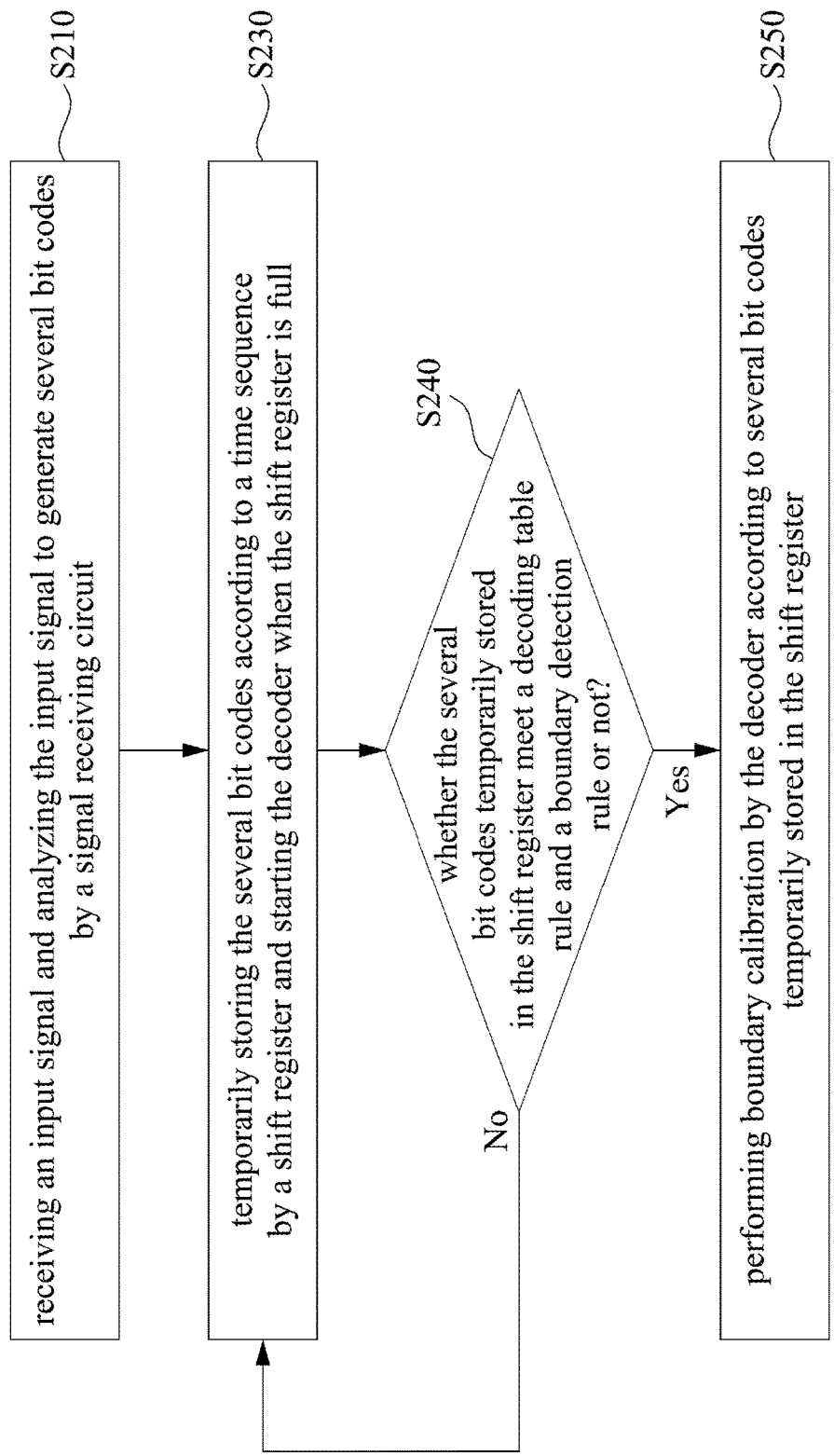
FIG. 2 is a flow chart illustrating a signal processing method according to some embodiments of the present disclosure.

Reference is made to FIG. 2. FIG. 2 is a flow chart illustrating a signal processing method 200 according to some embodiments of the present disclosure. The signal processing method 200 can be applied to the signal processor 100 as illustrated in FIG. 1. Reference is made to FIG. 1 and FIG. 2.

Reference is made to FIG. 3. FIG. 3 is a 4B/5B coding comparison chart according to some embodiments of the present disclosure. In some embodiments, the signal processor of FIG. 1 and the signal processing method of FIG. 2 in the present disclosure are applicable to the 4B/5B coding comparison diagram shown in FIG. 3.

For example, the bit codes of 4B encoding corresponding to the symbolic name 0 are 0000, the bit codes of 5B encoding corresponding to the symbolic name 0 are 11110. The rest and so on. It should be noted that, in some embodiments, when receiving or transmitting bit codes, the bit codes are transmitted by the least significant bit (LSB). That is, when the bit codes of 5B encoding corresponding to the symbolic name 0 are 11110, the receiving order of the signal receiving circuit 110 is 0, 1, 1, 1, and 1. The rest and so on.

Reference is made to FIG. 2 again. In operation S210, the signal receiving circuit receives the input signal and analyzes the input signal to generate several bit codes. In some embodiments, the input signal is transmitted by the signal transmitter (not shown), and is received by the signal receiving circuit 110 as illustrated in FIG. 1. In some embodiments, after the signal receiving circuit 110 receives the input signal, the Manchester encoding symbols in the input signal is analyzed to generate several bit codes, and the several bit codes are transmitted and temporarily stored in the shift register 130 in sequence.

In operation S230, the shift register temporarily stores several bit codes according to the time sequence, and the decoder is started when several temporarily stored spaces of the shift register are full with several bit codes. In some embodiments, the shift register 130 as illustrated in FIG. 1 temporarily stores several bit codes according to time sequence. When the temporarily stored spaces of the shift register 130 are full with the bit codes, the decoder 150 as illustrated in FIG. 1 is started. In some embodiments, before the decoder 150 parses out the 5B boundary, if new bit codes are received, the decoder 150 updates the shift register 130 and removes the oldest bit codes.

Figure 4:
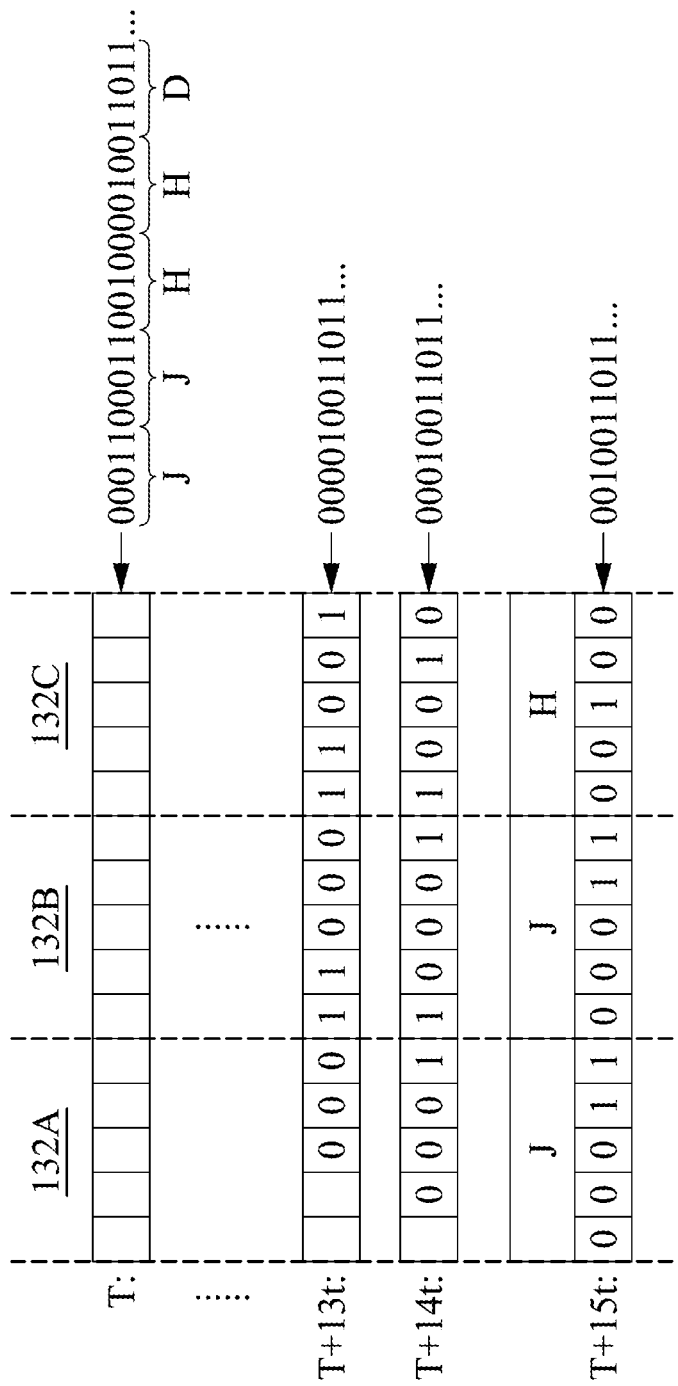
FIG. 4 is a schematic diagram illustrating a signal processing method according to some embodiments of the present disclosure.

As illustrated in FIG. 4. FIG. 4 is a schematic diagram illustrating a signal processing method 200 according to some embodiments of the present disclosure. In some embodiments, FIG. 4 is a schematic diagram of the signal processing method 200 illustrated according to the shift register 130 as illustrated in FIG. 1. As illustrated in FIG. 4, in time T, the signal receiving circuit 110 as illustrated in FIG. 1 receives the input signal, and the input signal includes bit codes 000110001100100001001101.

As illustrated in FIG. 4, in some embodiments, in the case of encoding with 5 codes, the shift register 130 as illustrated in FIG. 1 includes 3 temporarily stored spaces 132A, 132B, and 132C with 5 bit codes. As illustrated in FIG. 4, each of the temporarily stored spaces 132A to 132C includes 5 temporarily stored cells and can temporarily stores 5 bit codes.

As illustrated in FIG. 4, the shift register 130 temporarily stores the bit codes of the input signal according to the time sequence.

In time T+15, the temporarily stored spaces 132A to 132C of the shift register 130 are full with the bit codes 110000110010000. At this time, the decoder 150 as illustrated in FIG. 1 is started. On the other hand, from time T to time T+14t, since the shift register 130 is not full with the bit codes, the shift register 130 is not started.

Reference is made to FIG. 2 again. In operation S240, determining whether several bit codes temporarily stored in the shift register meets the decoding table rule and the boundary detection rule or not. In some embodiments, operation S240 is operated by the decoder 150 as illustrated in FIG. 1.

In some embodiments, the boundary detection rule is set by the user.

When it is determined that the several bit codes temporarily stored in the shift register meets the decoding table rule and the boundary detection rule in the operation S240, operation S250 is operated. In operation S250, the decoder performs boundary calibration according to several bit codes temporarily stored in the shift register.

On the other hand, when it is determined in operation S240 that the several bit codes temporarily stored in the shift register do not meet the decoding table rule and the boundary detection rule, operation S230 is operated. The decoder 150 as illustrated in FIG. 1 waits for the shift register 130 to continue to update the bit codes until the several bit codes temporarily stored in the shift register 130 meets the decoding table rule and the boundary detection rule.

Figure 5:
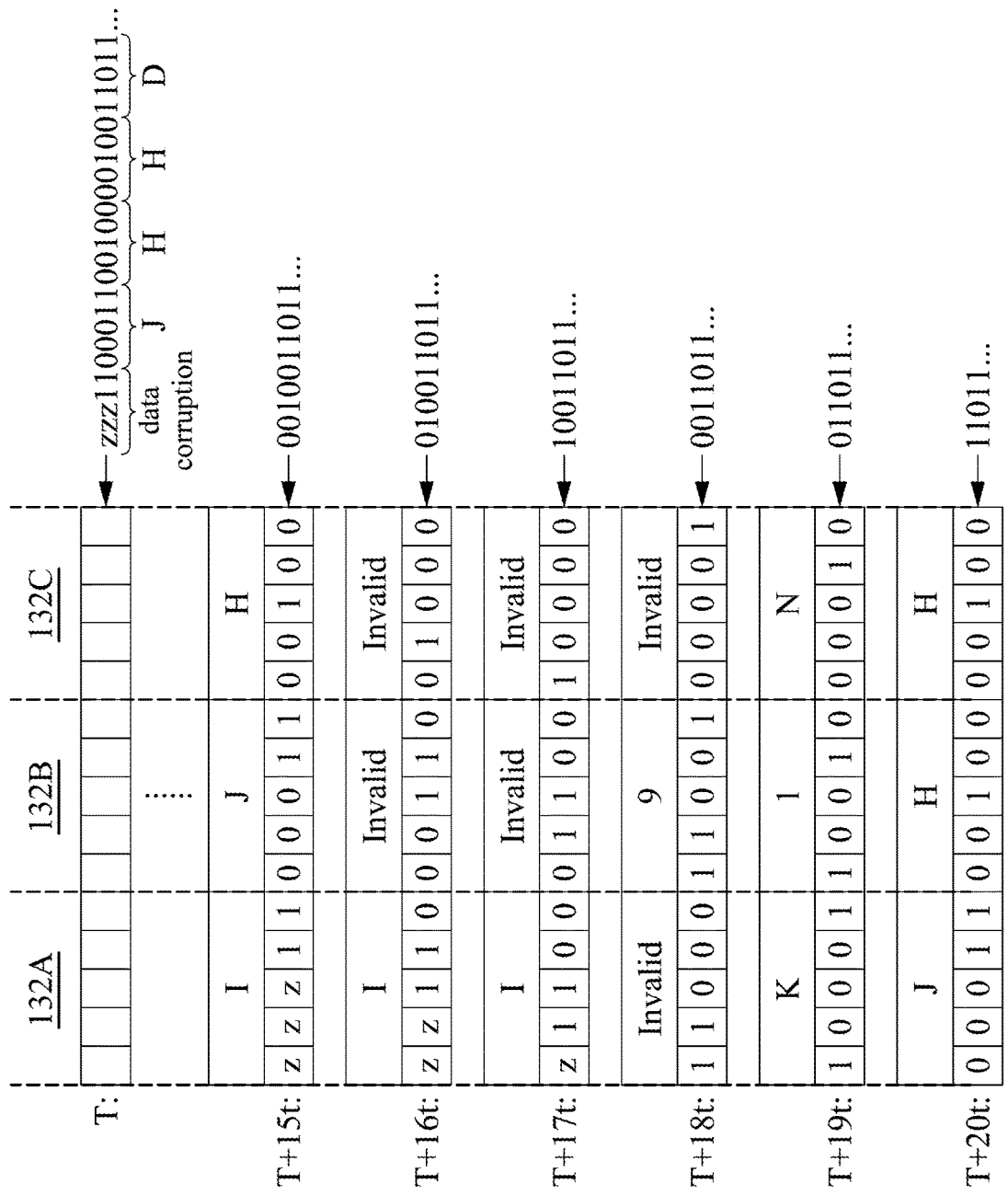
FIG. 5 is a schematic diagram illustrating a signal processing method according to some embodiments of the present disclosure.

Reference is made to FIG. 5. FIG. 5 is a schematic diagram illustrating another signal processing method 200 according to some embodiments of the present disclosure. In some embodiments, FIG. 5 is a schematic diagram of the signal processing method 200 according to the shift register 130 in FIG. 1. As illustrated in FIG. 5, in time T, in operation S210, the signal receiving circuit 110 as illustrated in FIG. 1 receives the input signal. The input signal includes the bit codes zzz11000110010000100111011, wherein z is the corrupted data.

In some embodiments, when it is determined that there is a bit code with data corruption, the decoder 150 recognizes the bit codes with data damage as SILENCE(I), and the corresponding symbolic name is I.

For example, reference is made to FIG. 5. In time T+15t, the bit codes temporarily stored in the temporarily stored space 132A are zzz11, the bit codes temporarily stored in the temporarily stored space 132B are 00011, the bit codes temporarily stored in the temporarily stored space 132C are 00100. According to the decoding table 300 in FIG. 3, the decoder 150 determines that the symbolic name corresponding to the 5 bit codes temporarily stored in the temporarily stored space 132A is the symbolic name I, the symbolic name corresponding to the 5 bit codes temporarily stored in the temporarily stored space 132B is the symbolic name J, and the symbolic name corresponding to the 5 bit codes temporarily stored in the temporarily stored space 132C is the symbolic name H.

In some embodiments, the decoder 150 is further configured to determine whether the bit codes temporarily stored in the shift register 130 meets the boundary detection rule or not, the boundary detection rule will be explained below.

In some embodiments, the specific symbolic name includes the symbolic name J, the symbolic name H, the symbolic name N, and the symbolic name T. In some embodiments, the symbolic name J is the synchronize J(SYNC(J)), the symbolic name H is the delimiter at the beginning of the data stream H(SSD(H)), the symbolic name N is the beacon N(BEACO(N)), and the symbolic name T is the heartbeat T(HB(T)).

Figure 6:
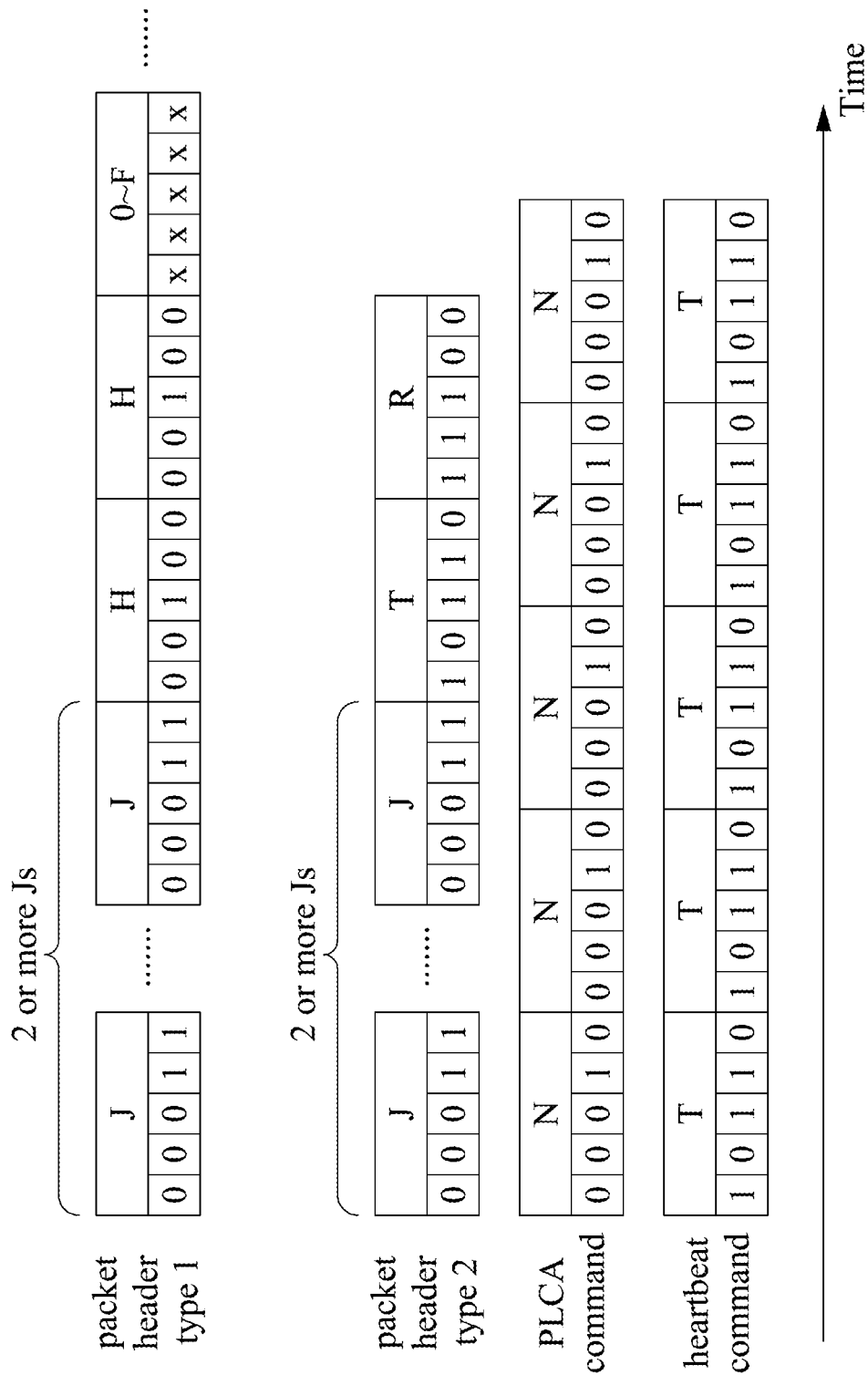
FIG. 6 is a schematic diagram illustrating a data format according to some embodiments of the present disclosure.

Reference is made to FIG. 6. FIG. 6 is a schematic diagram illustrating a data format according to some embodiments of the present disclosure. FIG. 6 shows 4 common 5B encoding data cell types. The first type is packet header type 1, which is composed of several symbolic names J followed by two symbolic names H and further followed by data. The second type is packet header type 2, which is composed of several symbolic names J followed by symbolic name T and further followed by symbolic name R. The third type is the PLCA command, which is composed of 5 symbolic names N. The fourth is the heartbeat command, which is composed of five symbolic names T.

It may be known from FIG. 6, the symbolic name J will be followed by the symbolic name J, the symbolic name H or the symbolic name T. In some embodiments, when the decoder 150 as illustrated in FIG. 1 determines that the symbolic name corresponding to the several bit codes temporarily stored in the temporarily stored space 132A as illustrated in FIG. 4 is the symbolic name J, the decoder 150 locks the decoding boundary according to the several bit codes temporarily stored in the shift register 130 for decoding.

Since both symbolic name H and symbolic name N only include 1 code bit with a value of 1 in 5B encoding. As long as there are consecutive combinations of symbolic name H and symbolic name N, it is easy to confuse the two and cause judgment errors. It may be known from FIG. 6 that according to the specification and the transmission format of the 10 BASE-T1S, only two symbolic name H appear, followed by data with symbolic name 0 to F. Therefore, using 3 shift registers 130 with the size of the temporarily stored space that temporarily stores 5 bit codes, the confusion between the symbolic name H and the symbolic name N is avoided.

In some embodiments, when the decoder 150 as illustrated in FIG. 1 determines that the symbolic name corresponding to the several bit codes temporarily stored in the temporarily stored space 132A as illustrated in FIG. 4 is the symbolic name H, the decoder 150 determines whether the several bit codes temporarily stored in the temporarily stored space 132B as illustrated in FIG. 4 corresponds to the symbolic name H or not after being decoded according to the rule of the decoding table 300 as illustrated in FIG. 3.

When the several bit codes temporarily stored in the temporarily stored space 132B corresponds to the symbolic name H after being decoded according to the decoding table 300 as illustrated in FIG. 3, the decoder 150 locks the decoding boundary according to the several bit codes temporarily stored in the shift register 130. That is, when two consecutive symbolic names H appear, the decoder 150 locks the decoding boundary.

Reference is made to FIG. 6. Since the symbolic name N appears 5 times continuously, even if the information of the 10 bit codes is lost, 3 symbolic names N still exist. Therefore, a boundary detection rule is set for this feature to avoid confusion with the symbolic name H. That is, when it is determined that 3 consecutive symbolic names N appear, the decoding boundary is locked.

In some embodiments, when the decoder 150 as illustrated in FIG. 1 determines that the symbolic name corresponding to the several bit codes temporarily stored in the temporarily stored space 132A as illustrated in FIG. 4 is the symbolic name N, the decoder 150 determines whether the several bit codes temporarily stored in the temporarily stored space 132B is the FIG. 3 symbolic name N or not after being decoded according to the decoding table 300. Furthermore, the decoder 150 further determines whether the symbolic name of the several bit codes temporarily stored in the temporarily stored space 132C is the symbolic name N or not after being decoded according to the rule of the decoding table 300 as illustrated in FIG. 3.

When the symbolic name of the several bit codes temporarily stored in the temporarily stored space 132B is the symbolic name N after being decoded according to the decoding table 300 as illustrated in FIG. 3, and the symbolic name of the several bit codes temporarily stored in the temporarily stored space 132C is the symbolic name N after being decoded according to the decoding table 300 as illustrated in FIG. 3, the decoder 150 locks the decoding boundary according to the several bit codes temporarily stored in the shift register 130.

Furthermore, as illustrated in FIG. 6, since the symbolic name T appears 5 times continuously, even the information of 10 bit codes is lost, 3 symbolic names T still exist. Therefore, the boundary detection rule is also set for this feature to avoid confusion with the symbolic name H. That is, when it is determined that 3 consecutive symbolic names T appear, the decoding boundary is locked.

In some embodiments, when the decoder 150 as illustrated in FIG. 1 determines that the symbolic name corresponding to the several bit codes temporarily stored in the temporarily stored space 132A as illustrated in FIG. 4 is the symbolic name T, the decoder 150 determines whether the several bit codes temporarily stored in the temporarily stored space 132B is the symbolic name T or not after being decoded according to rule of the decoding table 300 illustrated in FIG. 3. Furthermore, the decoder 150 determines whether the symbolic name of the several bit codes temporarily stored in the temporarily stored space 132C is the symbolic name T or not after being decoded according to rule of the decoding table 300 illustrated in FIG. 3.

When the symbolic name of the several bit codes temporarily stored in the temporarily stored space 132B is the symbolic name T after being decoded according to the rule of the decoding table 300 as illustrated in FIG. 3, and the symbolic name of the several bit codes temporarily stored in the temporarily stored space 132C is the symbolic name T after being decoded according to the rule of the decoding table 300 as illustrated in FIG. 3, the decoder 150 locks the decoding boundary for decoding according to several bit codes temporarily stored in the shift register 130.

In some other embodiments, the boundary detection rule can also include symbolic name I into consideration to increase flexibility in use. The boundary detection rule mentioned above is for illustrative purposes only, and the embodiments of the present disclosure is not limited thereof.

According to embodiments of the present disclosure, it is understood that the embodiments of the present disclosure provide a signal processing method and a signal processor. The misjudgments can be avoided with the methods of determining by the several combinations of the 5B symbolic names, at the same time, it has more flexibility to adjust and judge whether the boundary detection rule should be more rigorous or relaxed according to different situations, so that the accuracy of judging the 5B boundary can be effectively improved.

In some embodiments, the decoder 150 can be a server or other devices. In some embodiments, the decoder 150 can be a server, a circuit, a central processing unit (CPU), a microcontroller (MCU) with functions such as temporarily storing, computing, reading data, receiving signals or messages, and transmitting signals or messages, or other devices with equivalent functions. In some embodiments, the shift register 130 may be a circuit with a signal temporarily stored or a similar function. The signal receiving circuit 110 may be a component with functions such as signal receiving or a circuit with similar functions.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal processing method, comprising:
receiving an input signal and analyzing the input signal to generate a plurality of bit codes by a signal receiving circuit;
temporarily storing a first part of the plurality of bit codes according to a time sequence by a shift register, and starting a decoder when the shift register is full; and
performing a boundary calibration according to the first part of the plurality of bit codes by the decoder when the first part of the plurality of bit codes meets a decoding table rule and a boundary detection rule;
wherein the boundary detection rule comprises: when the first part of the plurality of bit codes corresponds to a plurality of symbolic names H in consecutive, a plurality of symbolic names N in consecutive, or a plurality of symbolic names T in consecutive, locking a decoding boundary by the decoder according to the first part of the plurality of bit codes.

2. The signal processing method of claim 1, further comprising:
performing updating by the shift register when the first part of the plurality of bit codes does not meet the decoding table rule and the boundary detection rule, so as to temporarily store a second part of the plurality of bit codes; and
determining whether the second part of the plurality of bit codes meets the decoding table rule and the boundary detection rule or not by the decoder.

3. The signal processing method of claim 2, wherein the second part of the plurality of bit codes is composed by shifting one bit of the first part of the plurality of bit codes.

4. The signal processing method of claim 1, wherein the shift register comprises a plurality of temporarily stored spaces, and each of the plurality of temporarily stored spaces comprises 5 temporarily stored cells, wherein the shift register is coded with 5 codes.

5. The signal processing method of claim 4, wherein the boundary detection rule comprises whether a part of the plurality of bit codes temporarily stored in a first temporarily stored space of the plurality of temporarily stored spaces meets one of a plurality of specific symbolic names or not after being decoded according to the decoding table rule.

6. The signal processing method of claim 5, wherein the plurality of specific symbolic names comprise a symbolic name J, a first symbolic name H of the plurality of symbolic names H, a first symbolic name N of the plurality of symbolic names N and a first symbolic name T of the plurality of symbolic names T.

7. The signal processing method of claim 5, wherein the boundary detection rule further comprises:
locking the decoding boundary by the decoder according to the first part of the plurality of bit codes temporarily stored in the shift register when the one of the plurality of specific symbolic names is a symbolic name J.

8. The signal processing method of claim 5, wherein the boundary detection rule further comprises:
when the one of the plurality of specific symbolic names is a first symbolic name H of the plurality of symbolic names H, determining whether a part of the plurality of bit codes temporarily stored in a second temporarily stored space of the plurality of temporarily stored spaces is a second symbolic name H of the plurality of symbolic names H or not after being decoded according to the decoding table rule by the decoder; and
locking the decoding boundary by the decoder according to the first part of the plurality of bit codes temporarily stored in the shift register when the part of the plurality of bit codes temporarily stored in the second temporarily stored spaces is the second symbolic name H after being decoded according to the decoding table rule.

9. The signal processing method of claim 5, wherein the boundary detection rule further comprises:
when the one of the plurality of specific symbolic names is a first symbolic name N of the plurality of symbolic names N, determining whether a part of the plurality of bit codes temporarily stored in a second temporarily stored space of the plurality of temporarily stored spaces is a second symbolic name N of the plurality of symbolic names N or not after being decoded according to the decoding table rule by the decoder;
determining whether a part of the plurality of bit codes temporarily stored in a third temporarily stored space of the plurality of temporarily stored spaces is a third symbolic name N of the plurality of symbolic names N or not after being decoded according to the decoding table rule by the decoder; and
locking the decoding boundary according to the first part of the plurality of bit codes temporarily stored in the shift register by the decoder when the part of the plurality of bit codes temporarily stored in the second temporarily stored spaces is the second symbolic name N after being decoded according to the decoding table rule and when the part of the plurality of bit codes temporarily stored in the third temporarily stored space is the third symbolic name N after being decoded according to the decoding table rule.

10. The signal processing method of claim 5, wherein the boundary detection rule further comprises:
when the one of the plurality of specific symbolic names is a first symbolic name T of the plurality of symbolic names T, determining whether a part of the plurality of bit codes temporarily stored in a second temporarily stored space of the plurality of temporarily stored spaces is a second symbolic name T of the plurality of symbolic names T or not after being decoded according to the decoding table rule by the decoder;
determining whether a part of the plurality of bit codes temporarily stored in a third temporarily stored space of the plurality of temporarily stored spaces is a third symbolic name T of the plurality of symbolic names T or not after being decoded according to the decoding table rule by the decoder; and
locking the decoding boundary according to the first part of the plurality of bit codes temporarily stored in the shift register by the decoder when the part of the plurality of bit codes temporarily stored in the second temporarily stored space is the second symbolic name T after being decoded according to the decoding table rule and a part of the plurality of bit codes temporarily stored in the third temporarily stored space is the third symbolic name T after being decoded according to the decoding table rule.

11. A signal processor, comprising:
a signal receiving circuit, configured to receive an input signal and to analyze the input signal to generate a plurality of bit codes;

a shift register, configured to temporarily store a first part of the plurality of bit codes according to a time sequence; and a decoder, configured to start when the shift register is full, and configured to perform a boundary calibration according to the first part of the plurality of bit codes when the first part of the plurality of bit codes meets a decoding table rule and a boundary detection rule;

wherein the boundary detection rule comprises: when the first part of the plurality of bit codes corresponds to a plurality of symbolic names H in consecutive, a plurality of symbolic names N in consecutive, or a plurality of symbolic names T in consecutive, locking a decoding boundary by the decoder according to the first part of the plurality of bit codes.

12. The signal processor of claim 11, wherein the shift register performs updating to temporarily store a second part of the plurality of bit codes when the first part of the plurality of bit codes does not meet the decoding table rule and the boundary detection rule, the decoder is further configured to determine whether the second part of the plurality of bit codes meets the decoding table rule and the boundary detection rule or not.

13. The signal processor of claim 12, wherein the second part or the plurality of bit codes is composed by shifting one bit of the first part of the plurality of bit codes.

14. The signal processor of claim 11, wherein the shift register comprises a plurality of temporarily stored spaces, and each of the plurality of temporarily stored spaces comprises 5 temporarily stored cells, wherein the shift register is coded with 5 codes.

15. The signal processor of claim 14, wherein the boundary detection rule comprises determining whether part of the plurality of bit codes temporarily stored in a first temporarily stored space of the plurality of temporarily stored spaces meets one of a plurality of specific symbolic names or not after being decoded according to the decoding table rule.

16. The signal processor of claim 15, wherein the plurality of specific symbolic names comprise a symbolic name J, a first symbolic name H of the plurality of symbolic names H, a first symbolic name N of the plurality of symbolic names N and a first symbolic name T of the plurality of symbolic names T.

17. The signal processor of claim 15, wherein when the one of the plurality of specific symbolic names is a symbolic name J, the decoder is further configured to lock the decoding boundary according to the first part of the plurality of bit codes temporarily stored in the shift register.

18. The signal processor of claim 15, wherein when the one of the plurality of specific symbolic names is a first symbolic name H of the plurality of symbolic names H, the decoder is further configured to determine whether a part of the plurality of bit codes temporarily stored in a second temporarily stored space of the plurality of temporarily stored spaces is a second symbolic name H of the plurality of symbolic names H or not after being decoded according to the decoding table rule, wherein when the part of the plurality of bit codes temporarily stored in the second temporarily stored spaces is the second symbolic name H of the plurality of symbolic names H after being decoded according to the decoding table rule, the decoder is further configured to lock the decoding boundary by the decoder according to the first part of the plurality of bit codes temporarily stored in the shift register.

19. The signal processor of claim 15, wherein when the one of the plurality of specific symbolic names is a first symbolic name N of the plurality of symbolic names N, a part of the plurality of bit codes temporarily stored in a second temporarily stored space of the plurality of temporarily stored spaces is a second symbolic name N of the plurality of symbolic names N after being decoded according to the decoding table rule, and a part of the plurality of bit codes temporarily stored in a third space of the plurality of temporarily stored spaces is a third symbolic name N of the plurality of symbolic names N after being decoded according to the decoding table rule, the decoder is further configured to lock the decoding boundary according to the first part of the plurality of bit codes temporarily stored in the shift register.

20. The signal processor of claim 15, wherein when the one of the plurality of specific symbolic names is a first symbolic name T of the plurality of symbolic names T, a part of the plurality of bit codes temporarily stored in a second temporarily stored space of the plurality of temporarily stored spaces is a second symbolic name T of the plurality of symbolic names T after being decoded according to the decoding table rule, and a part of the plurality of bit codes temporarily stored in a third temporarily stored space of the plurality of temporarily stored spaces is a third symbolic name T of the plurality of symbolic names T after being decoded according to the decoding table rule, the decoder is further configured to lock the decoding boundary according to the part of the plurality of bit codes temporarily stored in the shift register.

* * * * *